US007389007B2

(12) United States Patent
Michinaka

(10) Patent No.: US 7,389,007 B2
(45) Date of Patent: *Jun. 17, 2008

(54) SEMICONDUCTOR MEMORY APPARATUS

(75) Inventor: Shuji Michinaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/389,264

(22) Filed: Mar. 27, 2006

(65) Prior Publication Data

US 2006/0165299 A1 Jul. 27, 2006

Related U.S. Application Data

(62) Division of application No. 09/962,267, filed on Sep. 26, 2001, now Pat. No. 7,072,530.

(30) Foreign Application Priority Data

Sep. 28, 2000 (JP) .............................. 2000-297172

(51) Int. Cl.
*G06K 9/54* (2006.01)
(52) U.S. Cl. ...................... 382/305; 382/145
(58) Field of Classification Search ................ 382/306, 382/232, 145, 305; 365/200
See application file for complete search history.

(56) References Cited

U.S. PATENT DOCUMENTS

| 4,028,675 A | 6/1977 | Frankenberg ................ 711/106 |
| 4,930,066 A | 5/1990 | Yokota ........................ 711/149 |
| 5,289,432 A | 2/1994 | Dhong et al. ........... 365/230.05 |
| 5,719,819 A | 2/1998 | Maeno .................... 365/230.06 |
| 5,946,348 A | 8/1999 | Mizutani et al. ............. 375/222 |
| 6,005,796 A | 12/1999 | Sywyk et al. ................ 365/156 |
| 6,038,252 A | 3/2000 | Mizutani et al. ............. 375/222 |
| 6,262,912 B1 | 7/2001 | Sywyk et al. ................ 365/156 |
| 6,279,055 B1 | 8/2001 | Ito et al. ........................ 710/45 |
| 6,496,610 B2 | 12/2002 | Yamagishi et al. .......... 382/305 |
| 6,754,746 B1 | 6/2004 | Leung et al. ................ 710/100 |
| 7,072,530 B2 * | 7/2006 | Michinaka .................... 382/306 |

FOREIGN PATENT DOCUMENTS

| JP | 6-164340 | 6/1994 |
| JP | 8-116268 | 5/1996 |
| JP | 9-134590 | 5/1997 |
| JP | 02000215659 A | 8/2000 |
| WO | WO 98/27697 | 6/1998 |

OTHER PUBLICATIONS

August et al., "Cray X-MP: The Birth of a Supercomputer", IEEE, vol. 22, No. 1, Jan. 1989, pp. 45-52.*

* cited by examiner

*Primary Examiner*—Anh Hong Do
(74) *Attorney, Agent, or Firm*—Oblon, Spivak, McClelland, Maier & Neustadt, P.C.

(57) ABSTRACT

A semiconductor memory apparatus according to the present invention includes: two bank areas each having one-port memories capable of performing writing and reading only with separate timings; a writing control circuit for writing data into said one-port memories in one bank area of the two bank areas; and a reading control circuit for reading data from said one-port memories of the other bank area and zero-clearing memory areas from which data has been read while the writing control circuit is writing data into the one bank area.

8 Claims, 12 Drawing Sheets

```
(0,0) (0,2) ...... (0,6)
(1,0) (1,2) ...... (1,6)
  :     :          :
  :     :          :
(7,0) (7,2) ...... (7,6)
```

F I G. 4A

```
(0,1) (0,3) ...... (0,7)
(1,1) (1,3) ...... (1,7)
  :     :          :
  :     :          :
(7,1) (7,3) ...... (7,7)
```

F I G. 4B

| OUTPUT OF RUN-LENGTH ADDRESS GENERATOR | WRITING ADDRESS |
|---|---|
| 0 | A-0 |
| 1 | B-0 |
| 2 | A-4 |
| 3 | A-8 |
| 4 | B-4 |
| 5 | A-1 |
| 6 | B-1 |
| 7 | A-5 |
| 8 | B-8 |
| 9 | A-12 |
| 10 | A-16 |
| 11 | B-12 |
| 12 | A-9 |
| 13 | B-5 |
| 14 | A-2 |
| 15 | B-2 |
| 16 | A-6 |
| 17 | B-9 |
| 18 | A-13 |
| 19 | B-16 |
| 20 | A-20 |
| 21 | A-24 |
| 22 | B-20 |
| 23 | A-17 |
| 24 | B-13 |
| 25 | A-10 |
| 26 | B-6 |
| 27 | A-3 |
| 28 | B-3 |
| 29 | A-7 |
| 30 | B-10 |
| 31 | A-14 |
| 32 | B-17 |
| 33 | A-21 |
| 34 | B-24 |
| 35 | A-28 |
| 36 | B-28 |
| 37 | A-25 |
| 38 | B-21 |
| 39 | A-18 |
| 40 | B-14 |
| 41 | A-11 |
| 42 | B-7 |
| 43 | B-11 |
| 44 | A-15 |
| 45 | B-18 |
| 46 | A-22 |
| 47 | B-25 |
| 48 | A-29 |
| 49 | B-29 |
| 50 | A-26 |
| 51 | B-22 |
| 52 | A-19 |
| 53 | B-15 |
| 54 | B-19 |
| 55 | A-23 |
| 56 | B-26 |
| 57 | A-30 |
| 58 | B-30 |
| 59 | A-27 |
| 60 | B-23 |
| 61 | B-27 |
| 62 | A-31 |
| 63 | B-31 |

| 0 | 1 | 5 | 6 | 14 | 15 | 27 | 28 |
|---|---|---|---|----|----|----|----|
| 2 | 4 | 7 | 13 | 16 | 26 | 29 | 42 |
| 3 | 8 | 12 | 17 | 25 | 30 | 41 | 43 |
| 9 | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

↓ RUN–LENGTH ADDRESS GENERATOR

{0, 132}, {0, 23}, {1, 56}, {0, 41}, {2, 21}, {0, 30}, {0, 50}, {1, 37}, {1, 9}, {37, 5}

SEMICONDUCTOR MEMORY APPARATUS

CROSS REFERENCE TO RELATED APPLICATIONS

This application is Divisional of U.S. patent application Ser. No. 09/962,267, filed Sep. 26, 2001, now U.S. Pat. No. 7,072,530, and claims benefit of priority under 35 USC §119 to Japanese Patent Application No. 2000-297172, filed on Sep. 28, 2000. The entire contents of these applications are incorporated by reference herein.

BACKGROUND OF THE INVENTION (i) Field of the Invention

The present invention relates to a semiconductor memory apparatus for reading data and then zero-clearing, and more particularly to a semiconductor memory apparatus which is imbedded in an image compressing/uncompressing LSI and the like and suitable for run-length encoding or zigzag scan conversion.

(ii) Description of the Related Art

In an image compressing/uncompressing technique such as MPEG, there is used an encoding technique by which an original image is divided into blocks and quadrature conversion such as DCT (Discrete Cosine Transform) is applied to each block to quantize its DCT coefficients, and then the quantized coefficients are aligned in data rows in the zigzag scanning order to perform run-length encoding in the zero-run+non-zero coefficient format.

FIG. 9 shows an example of typical zigzag scanning. In the drawing, a lattice area indicates pixel positions of a block composed of 8×8 pixels in the vertical and horizontal directions, and numeric figures in the lattice area indicate orders for rearranging data. In this example, each pixel is arranged in order, i.e. a pixel (0, 0) is arranged at zeroth; a pixel (0, 1), at first; and a pixel (1, 0), at second, . . . .

FIG. 10 shows an example in which zigzag scan conversion is performed based on the quantized DCT coefficients to carry out run-length encoding. FIG. 10A shows the quantized DCT coefficients of a block composed of 8×8 pixels and includes many zero components as a result of quantization. When the quantized DCT coefficients are aligned in the order of arrows, a data string such as shown in FIG. 10B is obtained. When a non-zero coefficient and a number of zeros (zero runs) immediately before that coefficient forms a pair as one symbol with respect to this data string, 10 run-length codes such as shown in FIG. 10C are obtained.

As a technique for decoding block data subjected to zigzag scanning and run-length encoding by the above-described procedure, there is a technique for preparing a zero-cleared memory in advance and writing only non-zero coefficients for addresses skipped by the zero run.

FIG. 11 is a schematic block diagram of this technique. An apparatus shown in FIG. 11 includes a run-length address generator 11, a bank memory 1 composed of two two-port memories, and a zigzag address generator 12. The bank memory 1 shown in FIG. 11 has, for example, two bank areas and can simultaneously perform writing at addresses generated by the run-length generator 11 and reading from addresses generated by the zigzag address generator 12. Incidentally, if the performance can be degraded by half, only one bank may be provided and the same bank may be sequentially switched without simultaneously performing writing and reading.

With a bank selection signal shown in FIG. 11, one bank area is used for writing and the other bank area is used for reading. FIG. 11 shows an example in which a bank area B0 is used for writing and a bank area B1 is used for reading.

The run-length address generator shown in FIG. 11 adds a register which is first initialized to "−1", zero runs and 1 in an accumulative adder composed of a register 21 and an adder 22, and updates the register with the added result. Thereafter, the run-length address generator increments a value of the register by "zero runs+1" and determines the incremented value as an address for writing.

Taking run-length codes in FIG. 10C as an instance, data is stored in the memory in the order of arrangement in FIG. 10B. For example, 132 is written at an address 0, 23 is written at an address 1, 56 is written at an address 3, . . . . Then, processing for one block is completed by 10 times of writing.

On the other hand, when reading a content of the bank memory 1, data is read from addresses generated by the zigzag address generator 12, and zeros are written in the memory areas from which data has been read.

When reading data in the order of, e.g., horizontal scanning, the zigzag address generator 12 generates addresses in the order of 0, 1, 5, 6, 14, 15, 27, 28, 2, 4, 7, 13, 16, . . ., as shown in FIG. 9. A zigzag address generator 12 for generating such addresses can be readily composed of a counter and a conversion table.

Furthermore, if the conversion table is changed, data can be read in any order. Thus, zeros are written while data is read on the reading side, the bank memory 1 is initialized to zero when the reading of all the addresses is finished, and it can be used as a bank for writing next data.

Incidentally, when neither bank is yet initialized, a circuit for writing zeros for initialization can be additionally provided. Moreover, data of run-zero data-zero can be written for blocks at the writing size, an all the memory areas can be zero-cleared by reading and nullifying data at the reading side.

In the apparatus shown in FIG. 11, it is possible to efficiently carry out the decoding operation. However, as apparent from the memory at the reading side, the read modified write operation is required, and two-port memories which can simultaneously perform reading and writing are necessary. When the bit/word configuration of the memory is the same, an area of the memory increases in proportion to a number of ports. Therefore, the bank memory 1 of this apparatus has a circuit scale which is approximately two fold of that of two banks composed of one-port memories having the same bit/word configuration.

On the other hand, FIG. 12 is a schematic block diagram in which the function similar to that of the decoding circuit in FIG. 11 is realized by one-port memories. The apparatus of FIG. 12 is provided with the one-port memories one by one, to simultaneously execute run-length address writing, zigzag address reading and zero-clearing.

FIG. 12 shows an example in which a bank area composed of a one-port memory M1 is used for run-length address writing, a bank area composed of a one-port memory M2 is used for zigzag address reading, and a bank area composed of a one-port memory M3 is used for zero-clearing. By sequentially switching uses of the three bank areas every time the bank selection signal is changed over, the function which is substantially the same as that of the two-port memories shown in FIG. 11 ca be realized. In addition, the circuit scale can be reduced to approximately ¾ of that illustrated in FIG. 11.

However, since the both apparatuses depicted in FIGS. 11 and 12 has the zero clear function thereto, there is a problem that a circuit area is greatly increased (approximately two fold in FIG. 11, and approximately 1.5 fold in FIG. 12) as compared with regular bank memories having two banks each having one-port memories. Therefore, a chip area becomes large when integrated, thereby increasing the chip cost.

SUMMARY OF THE INVENTION

According to the present invention, there is provided a semiconductor memory apparatus comprising: two bank areas each having one-port memories capable of performing writing and reading only with separate timings; a writing control circuit configured to write data into said one-port memories in one bank area of said two bank areas; and a reading control circuit configured to read data from said one-port memories in the other bank area and zero-clearing memory areas from which data has been read, while said writing control circuit is writing data into said one bank area.

BRIEF DESCRIPTION OF THE DRAWINGS

FIGS. 4A and 4B are views illustrating the operation of a writing control circuit;

FIG. 6 is a view showing an example of an address conversion table;

FIG. 9 is a view showing an example of zigzag scanning;

DESCRIPTION OF THE PREFERRED EMBODIMENTS

A semiconductor memory apparatus according to the present invention will now be described in detail with reference to the accompanying drawings.

First Embodiment

Figure 1:
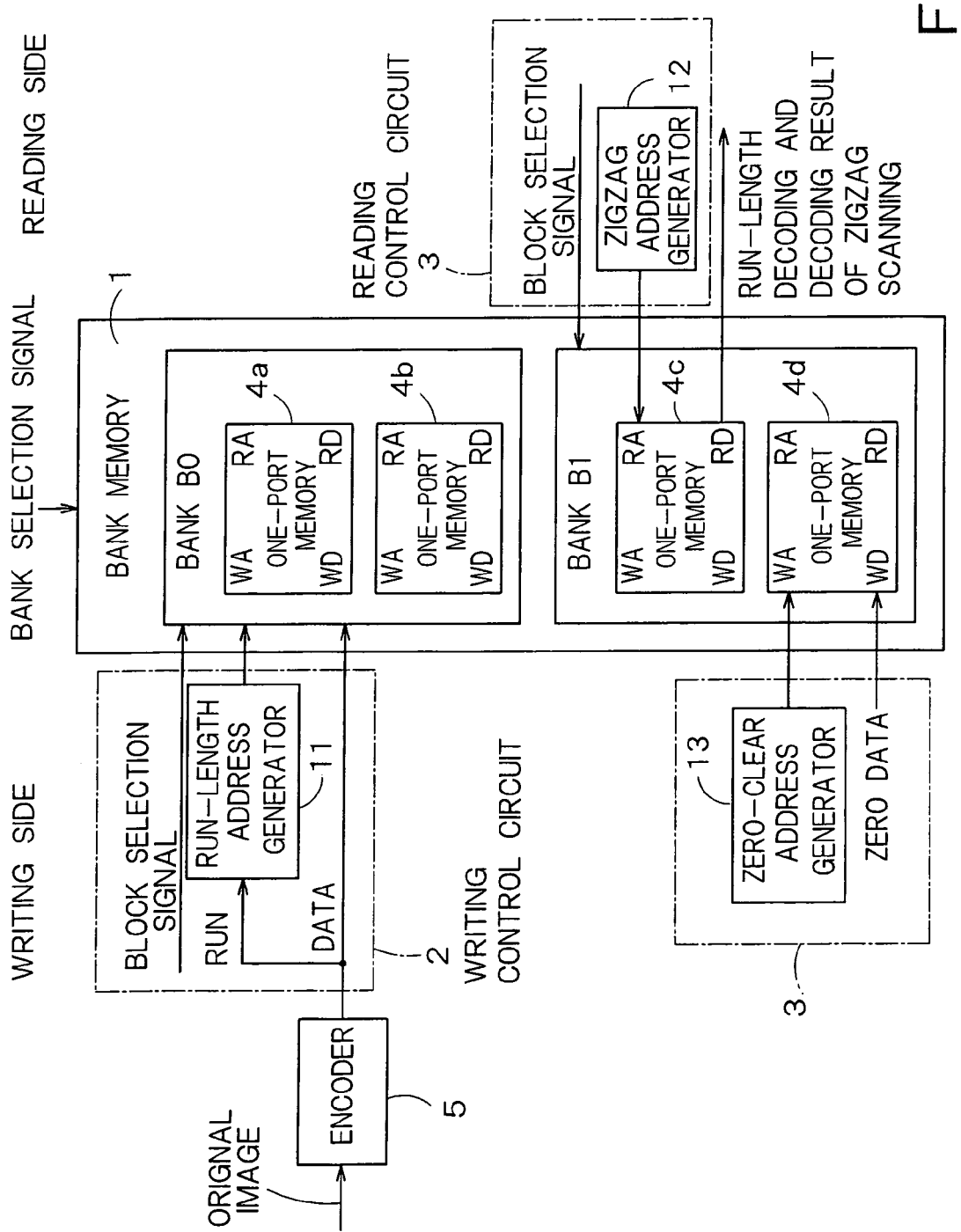
FIG. 1 is a block diagram showing a detailed structure of a first embodiment of a semiconductor memory apparatus according to the present invention.

FIG. 1 is a block diagram showing a schematic configuration of a first embodiment of a semiconductor memory apparatus according to the present invention. The semiconductor memory apparatus depicted in FIG. 1 includes a bank memory 1 composed of two bank areas B0 and B1, a writing control circuit 2 selectively connected to one of the two bank areas, and a reading control circuit 3 selectively connected to the other bank area.

Figure 2:
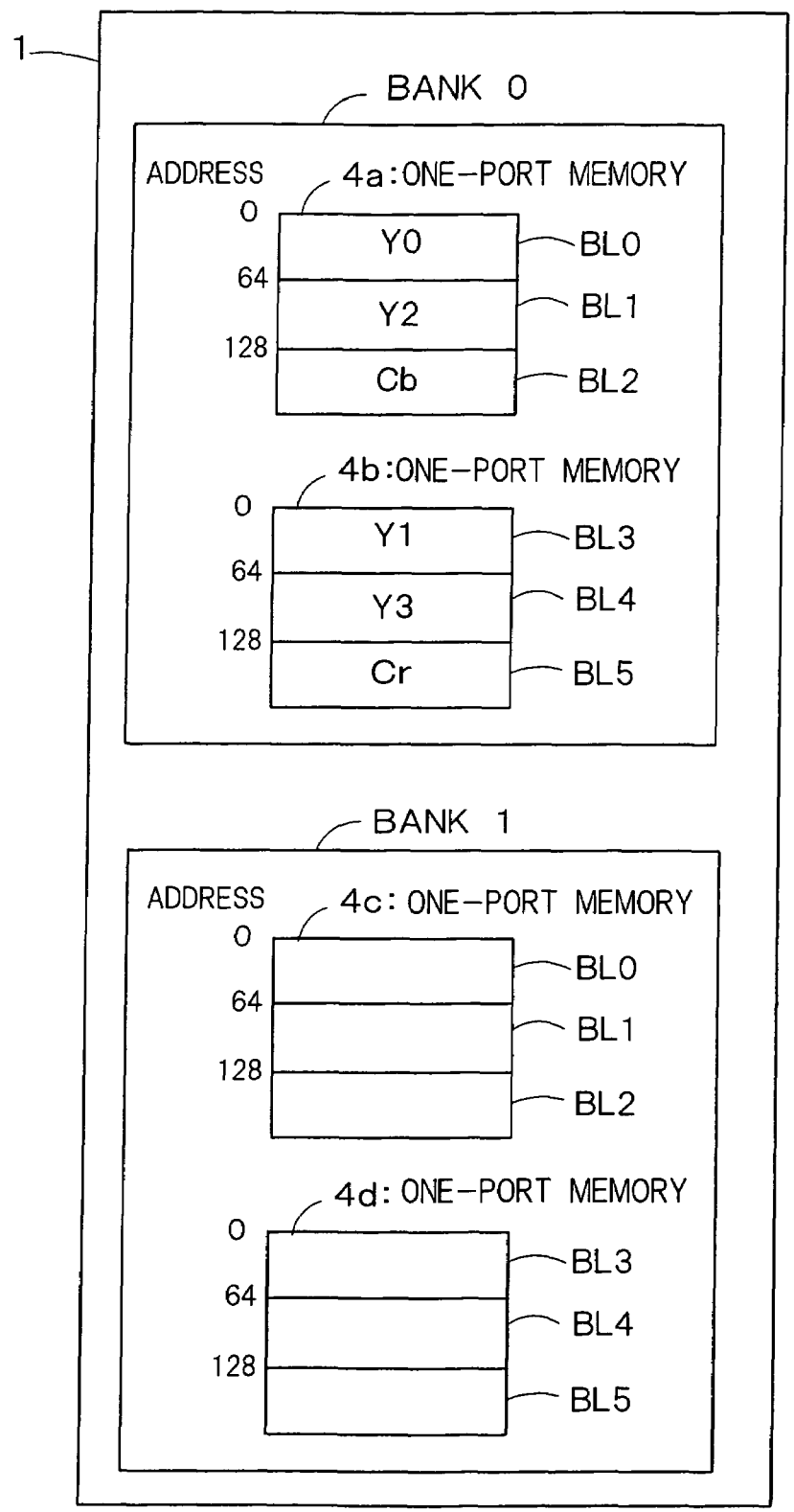
FIG. 2 is a view showing an example of writing data in each block in a bank area in the order of Y0, Y1, Y2, Y3, Cb, and Cr.

Each of the bank areas B0 and B1 has two one-port memories (4a, 4b) and (4c, 4d), and each of the one-port memories 4a to 4d is divided into three blocks as shown in FIG. 2. For example, when one block has a capacity corresponding to 8×8 pixels, a capacity of 8×8×6=384 words is required per bank. In this case, each of the one-port memories 4a to 4d has a capacity corresponding to 192 words.

FIG. 1 shows an example in which the writing control circuit 2 is connected to the bank area B0 and the reading control circuit 3 is connected to the bank area B1. In FIG. 1, after writing data to the bank area B0, when the read-out from the bank area B1 and zero-clear is finished, the reading control circuit 3 is connected to the bank area B0 and the writing control circuit 2 is connected to the bank area B1. That is, the writing control circuit 2 and the reading control circuit 3 alternately access the bank areas B0 and B1, respectively.

The writing control circuit 2 selects one block for writing based on a block selection signal, and writes run-length encoding data into the selected block based on addresses from a run-length address generator 11. The run-length encoding data is generated by an encoder 5 shown in FIG. 1.

The reading control circuit 3 includes a zigzag address generator 12 which generates zigzag addresses used for reading data from a block, into which data is written in accordance with addresses from the run-length address generator 11, by an arbitrary scanning method such as horizontal raster scanning or vertical raster scanning, and a zero-clear address generator 13 for zero-clearing read address positions.

In case of writing data into the bank areas B0 and B1, the writing control circuit 2 alternately writes data into the two one-port memories in each bank. For example, FIG. 2 shows an example of writing data into each block in the bank area B0 in the order of Y0, Y1, Y2, Y3, Cb and Cr. In case of FIG. 2, Y0, Y2 and Cb are stored in the one-port memory 4a, and Y1, Y3 and Cr are stored in the one-port memory 4b.

On the other hand, the reading control circuit 3 reads each set of pixel data in the block by each block based on addresses from the zigzag address generator 12. When the reading of all the data in the block is finished, the reading control circuit 3 zero-clears the read block by using the zero-clear address generator 13. For example, when the zigzag address generator 12 generates zigzag addresses in each block in the order of BL0, BL3, BL1, BL4, BL2, and BL5, data is read in the order of Y0, Y1, Y2, Y3, Cb and Cr and the blocks from which data has been read are sequentially zero-cleared by each block.

Zero-clearing also takes the same cycle time as that of usual reading. Therefore, assuming that data for one address is read in one cycle, zero-clearing of a bank is completed after the last block in the bank is read and then further 64 cycles lapse.

As described above, in the first embodiment, the bank memory 1 is composed of the two bank areas B0 and B1, data is written into one bank by each block while data is read from the other bank by each block, and the block from which data has been read is zero-cleared. Accordingly, it is no longer necessary to use two-port memories as in the prior art.

Further, the bank memory 1 is composed of the two bank areas B0 and B1, and each bank is composed of the two one-port memories. Therefore, the circuit scale can be greatly reduced as compared with a case where each bank is composed of two two-port memories or a case where it is composed of three one-port memories. For example, each bank is composed of two two-port memories each corresponding to 384 words in the prior art, whereas each bank can be composed of four one-port memories each corresponding to 192 words according to this embodiment, which leads to reduction of a packaging area by approximately half. Furthermore, as compared with a case where each bank is composed of three one-port memories each corresponding to 384 words, a packaging area can be reduced to approximately ⅔.

Second Embodiment

In case of the first embodiment, after reading data from a last block in the bank, the block must be zero-cleared. Therefore, there is a problem that a considerably long time is required for completing zero-clearing. Thus, a second embodiment has a feature in which after reading data in the block, zero-clearing of the block is completed as rapidly as possible.

Figure 3:
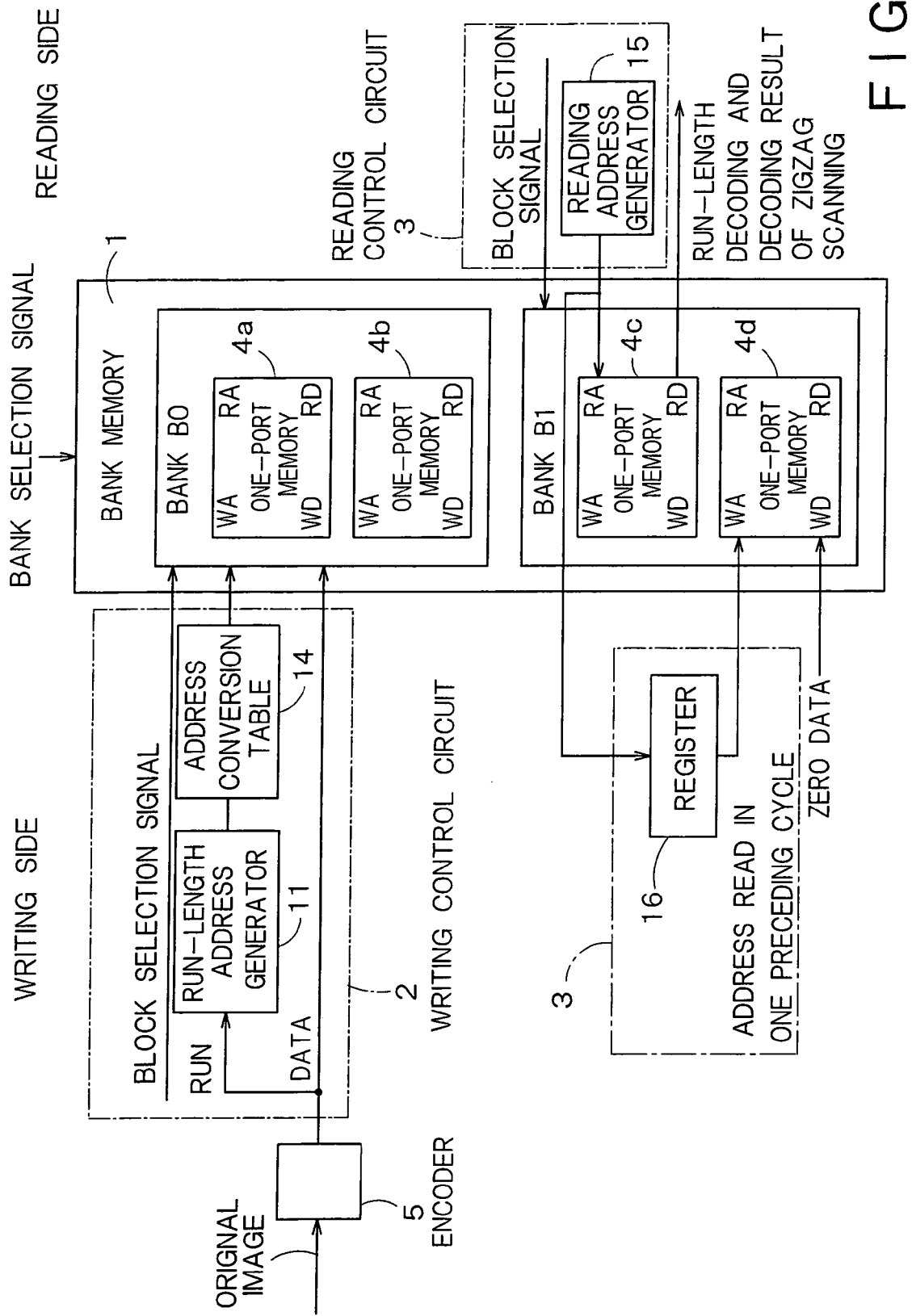
FIG. 3 is a block diagram showing a schematic configuration of a second embodiment of a semiconductor memory apparatus according to the present invention.

FIG. 3 is a block diagram showing a schematic configuration of the second embodiment of a semiconductor memory apparatus according to the present invention. The semiconductor memory apparatus shown in FIG. 3 is different from the first embodiment in the configuration of the writing control circuit 2 and the reading control circuit 3, and these circuits access the bank memory 1 by a technique different from the first embodiment.

The writing control circuit 2 shown in FIG. 3 includes a run-length address generator 11 for generating run-length addresses, and an address conversion table 14 for converting run-length addresses into other addresses.

The reading control circuit shown in FIG. 3 includes a reading address generator 15 for generating reading addresses, and a register 16 for latching reading addresses.

FIGS. 4A and 4B are views illustrating the operation of the writing control circuit 2, and shows an example of writing data into a bank area B0. In FIGS. 4A and 4B, (0, 0) indicates pixel data at an upper left corner; (0, 7), pixel data at an upper right corner; and (7,0), pixel data at a lower left corner; and (7, 7), pixel data at a lower right corner. FIG. 4A shows data stored in a one-port memory 4a, and FIG. 4B shows data stored in a one-port memory 4b.

This embodiment is characterized in that the one-port memories 4a and 4b are alternately read when reading data. Therefore, run-length addresses outputted from the run-length generator 11 are subjected to address conversion, and then data is written into the one-port memories 4a and 4b.

Figure 5:
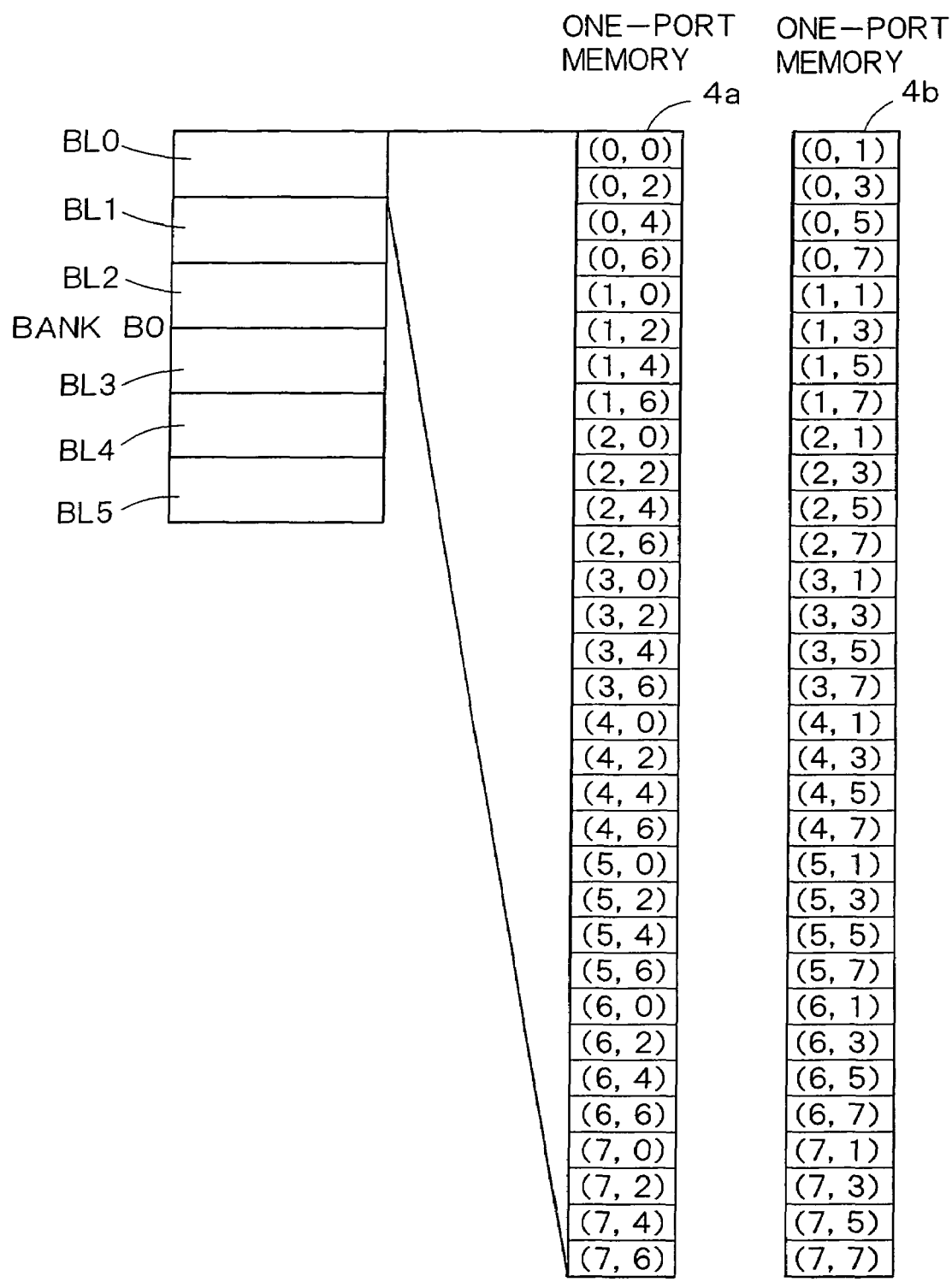
FIG. 5 is a view showing data written in one-port memories.

Specifically, as shown in FIG. 5, data of pixels (0, 0), (0, 2), (0, 4) . . . is written into a block BL0 of the one-port memory 4a, and data of pixels (0, 1), (0, 3), (0, 5) . . . is written into a block BL0 of the one-port memory 4b. If such data is written in advance, data of each pixel can be read in the horizontal raster order of (0,0), (0,1), (0,2) . . . by alternately reading the one-port memories 4a and 4b.

In order to write data into the one-port memories by the above-described procedure, run-length addresses must be subjected to address conversion. Thus, the writing control circuit 2 carries out address conversion based on such an address conversion table 14 as shown in FIG. 6 and then writes data into the one-port memories.

The address conversion table 14 illustrated in FIG. 6 stores pixel data (FIGS. 4A and 4B) every other pixel in the one-port memory 4a in the horizontal raster direction, and generates addresses used for writing pixel data (FIG. 4B) adjacent to the former pixel data into the one-port memory 4b.

In the example described below, the operation of the address conversion table 14 in case of writing each data from the pixel (0, 0) to the pixel (0, 7) in the horizontal direction into the one-port memories 4a and 4b will be described. A run-length address 0 in FIG. 9 is first converted into an address 0 (A-0 in FIG. 6) in the one-port memory 4a, and a run-length address 1 which is adjacent to the former address on the right is converted into an address 0 (B-0 in FIG. 6) in the one-port memory 4b.

Similarly, a run-length address 5 is converted into an address 1 (A-1 in FIG. 6) in the one-port memory 4a; a run-length address 6 into an address 1 (B-1 in FIG. 6) in the one-port memory 4b; a run-length address 14 into an address 2 (A-2 in FIG. 6) in the one-port memory 4a; a run-length address 15 into an address 2 (B-2 in FIG. 6) in the one-port memory 4b; a run-length address 27 into an address 3 (A-3 in FIG. 6) in the one-port memory 4a; and a run-length address 28 into an address 3 (B-3 in FIG. 6) in the one-port memory 4b, respectively.

Figures 10A, 10B, 10C:
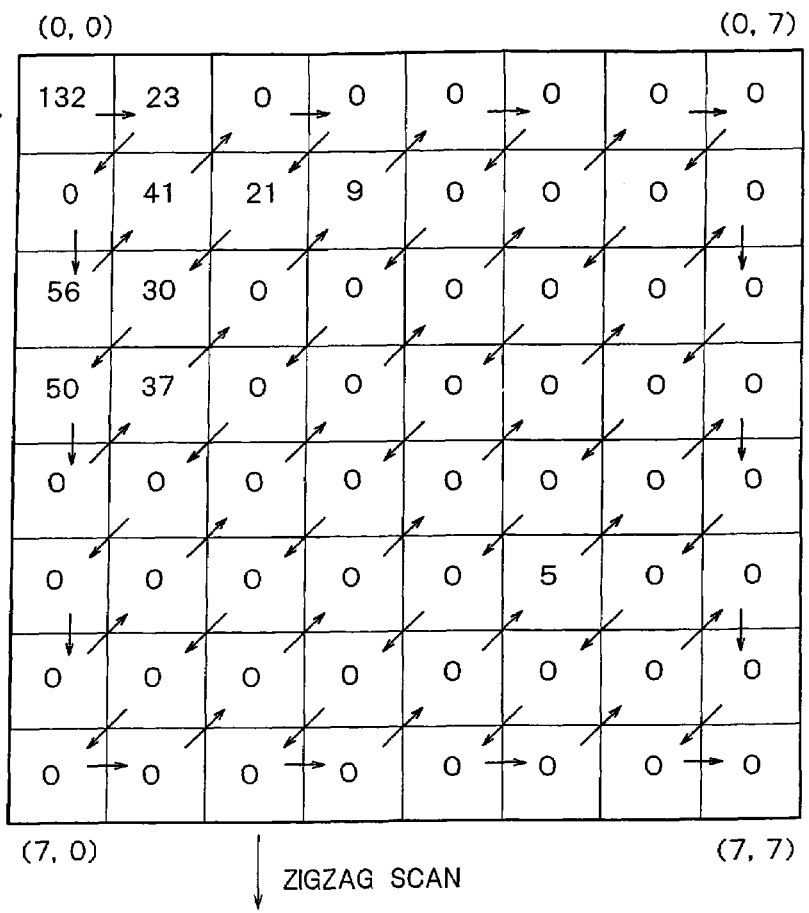
FIGS. 10A to 10C are views showing an example of performing zigzag scan conversion and executing run-length encoding.
Figure 11:
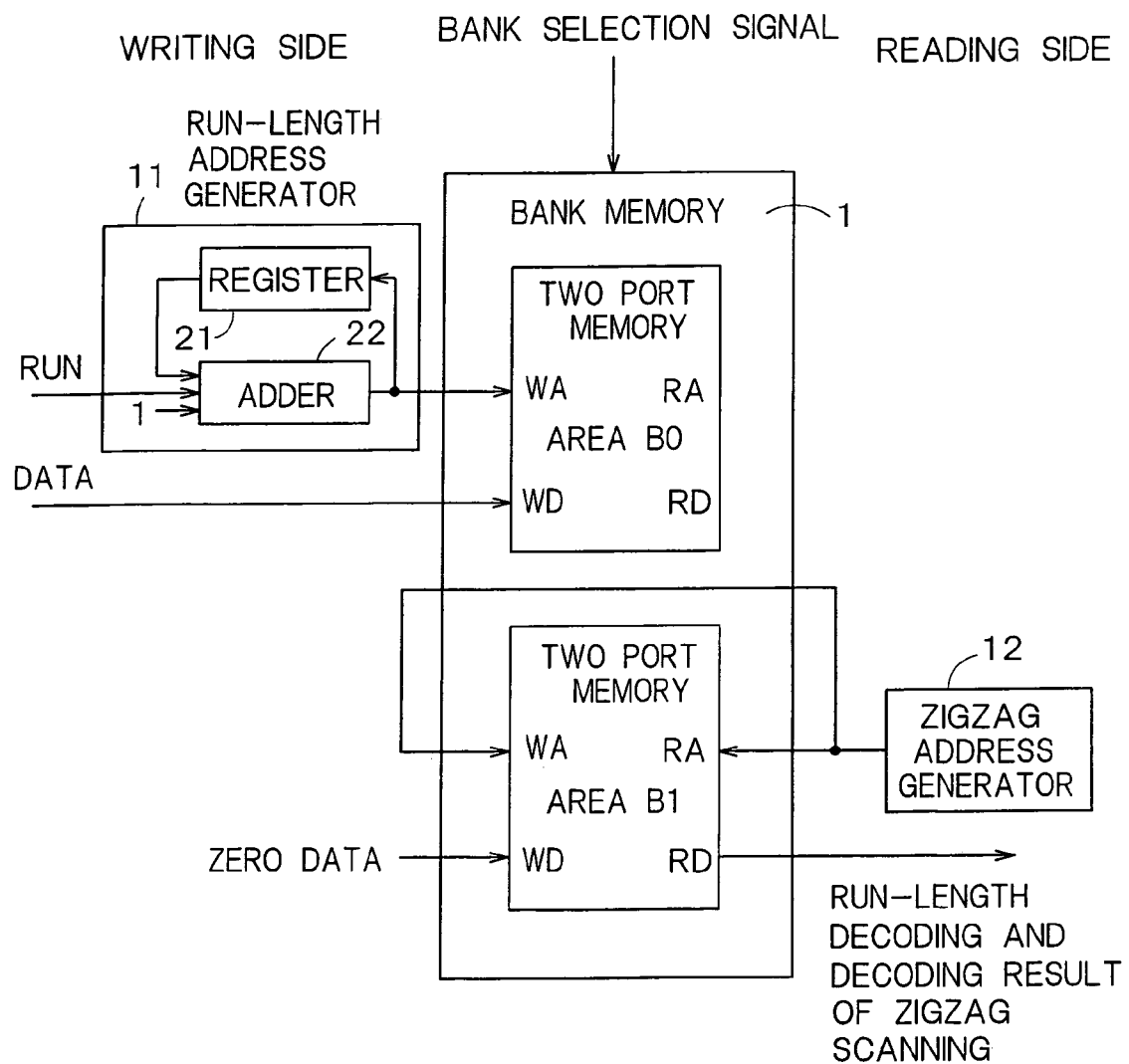
FIG. 11 is a schematic block diagram showing an apparatus for realizing a technique for decoding block data subjected to zigzag scanning and run-length encoding.
Figure 12:
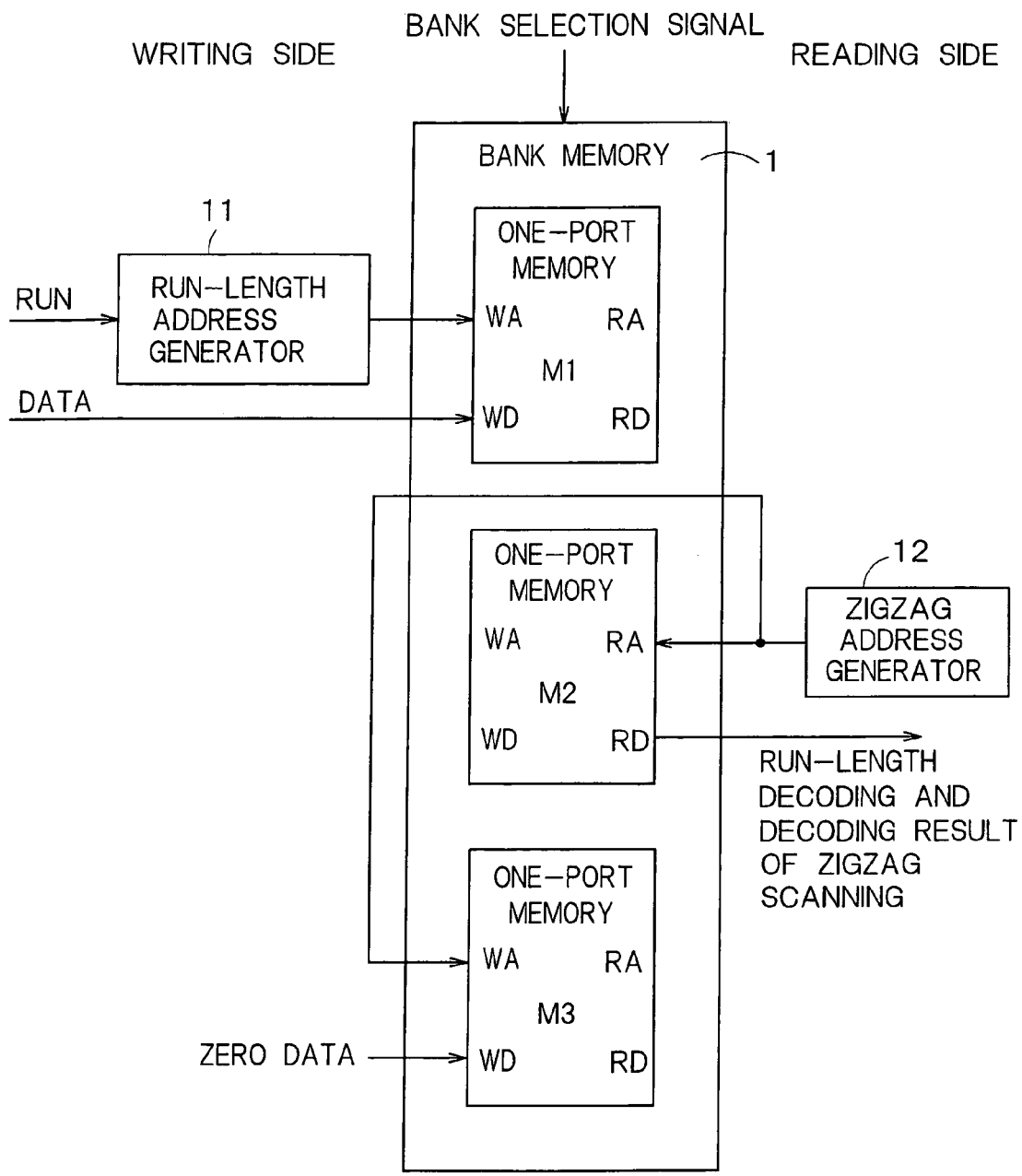
FIG. 12 is a schematic block diagram showing a case where a function similar to that of a decoding circuit illustrated in FIG. 11 is realized by one-port memories.

Furthermore, for example, in case of run-length codes shown in FIG. 10C, the run-length address generator 11 outputs run-length addresses in the order of an address 0 corresponding to data 132, an address 1 corresponding to data 23, an address 3 corresponding to data 56, an address 4 corresponding to data 41, an address 7 corresponding to data 21, an address 8 corresponding to data 30, an address 9 corresponding to data 50, an address 11 corresponding to data 37, an address 13 corresponding to data 9, and an address 51 corresponding to data 5.

Therefore, the addresses after carrying out address conversion in the address conversion table 14 shown in FIG. 6 are the address 0 (A-0) in the one-port memory 4a, the address 0 (B-0) in the one-port memory 4b, the address 8 (A-8) in the one-port memory 4a, the address 4 (B-4) in the one-port memory 4b, the address 5 (A-5) in the one-port memory 4a, the address 8 (B-8) in the one-port address 4b, the address 12 (A-12) in the one-port address 4a, the address 12 (B-12) in the one-port address 4b, the address 5 (B-5) in the one-port address 4b, and the address 22 (B-22) in the one-port address 4b in the mentioned order.

On the other hand, the reading control circuit 3 reads data alternately from the one-port memories 4a and 4b. That is, the reading control circuit 3 reads data alternately from the two one-port memories in the bank by each pixel, and zero-clears in a next reading cycle memory areas from which data has been read. As a result, after reading the last data in the bank, zero-clearing of the last data can be completed in the next cycle, namely, zero-clearing of all data in the bank can be completed.

As described above, since writing and reading data into/from the bank by unit smaller than the block in the second embodiment, all the areas in the bank can be zero-cleared in a shorter time than that of the first embodiment after completion of reading data in the bank.

Although the example for alternatively selecting and reading the one-port memory in the bank has been described, the one-port memories may be alternately selected by each pixel.

Third Embodiment

A third embodiment is characterized in reduction of a number of one-port memories in each bank area.

Figure 7:
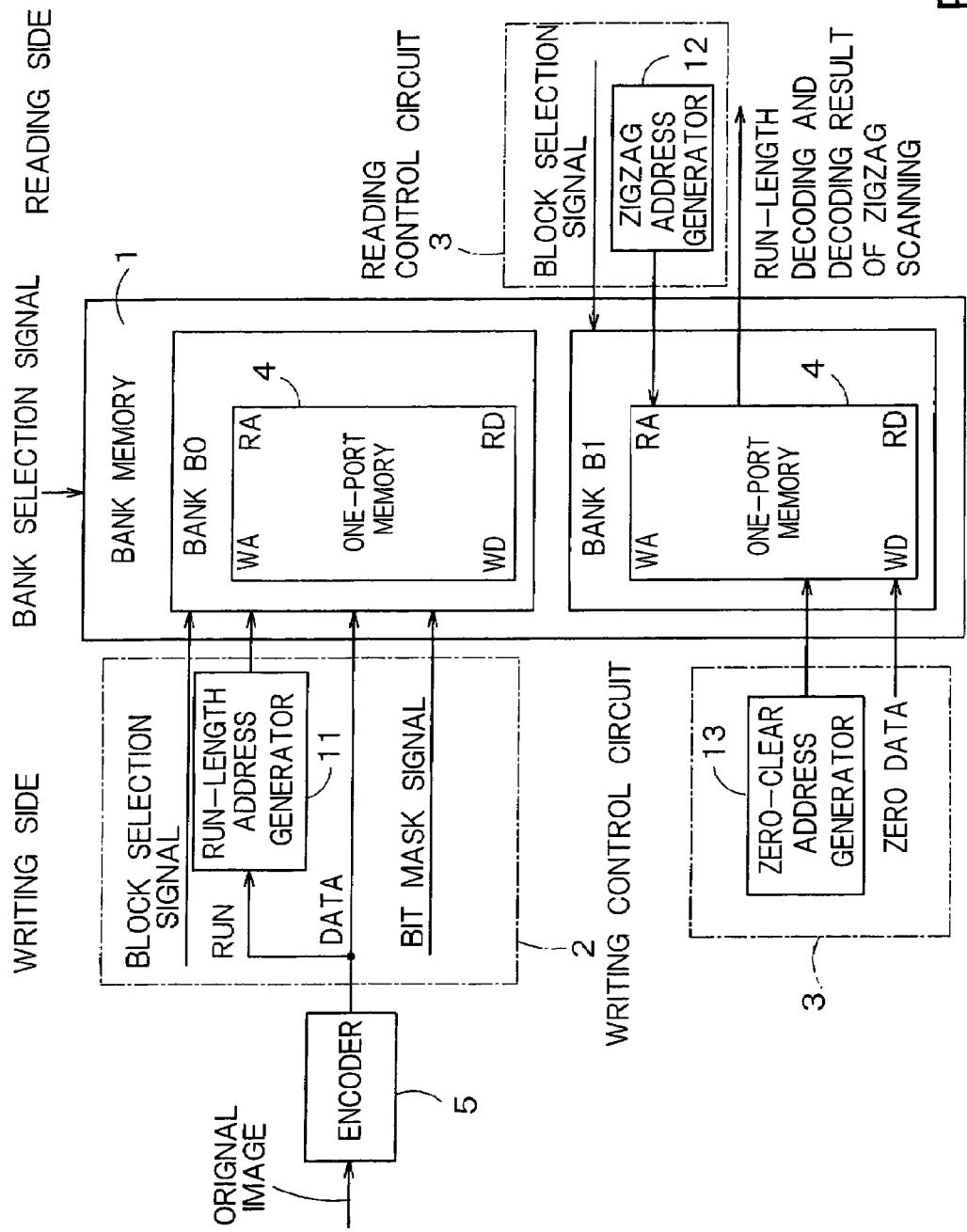
FIG. 7 is a block diagram showing a schematic configuration of a second embodiment of a semiconductor memory apparatus according to the present invention.

FIG. 7 is a block diagram showing a schematic configuration of the third embodiment of a semiconductor memory apparatus according to the present invention. The semiconductor memory apparatus shown in FIG. 7 is common to that illustrated in FIG. 1 in that the bank memory 1 composed of the two bank areas B0 and B1 is provided. However, a single one-port memory is provided in each of the bank areas B0 and B1 in this embodiment.

Each one-port memory has a data bus width which is two fold of that of the one-port memory shown in FIG. 1. That is, although data is divided and stored in the two one-port memories in the first embodiment, whereas data is stored in a signal one-port memory in this embodiment.

Selection of either an upper side bit string and a lower side bit string depends on the logic of a bit mask signal. For example, if the bit mask signal is on the high level, data is written by using an upper side bit string. If the bit mask signal is on the low level, data is written by utilizing a lower side bit string.

In the first embodiment, one of the two one-port memories in the selected bank area is alternately selected by each block in order to write data. In this embodiment, however, a data bus of the one-port memory in the selected bank area is divided into an upper side bit string and a lower side bit string, and these bit strings are alternately selected by each block in order to write data. Specifically, the logic of the bit mask signal is alternately switched, and an upper side bit string and a lower side bit string of the data bus of the one-port memory are alternately selected so that data can be written into this memory.

Further, in case of reading, since data is read by utilizing all of the data bus, data whose quantity is two fold of that of the first embodiment can be read in one reading cycle. Therefore, a number of times of accessing the one-port memory for reading data is reduced to ½ of that of the first embodiment, and the reading cycle can be thereby set longer.

In this embodiment, the fact that the reading cycle can be set longer is utilized, and the memory area from which data has been read is zero-cleared during reading data.

Figure 8:
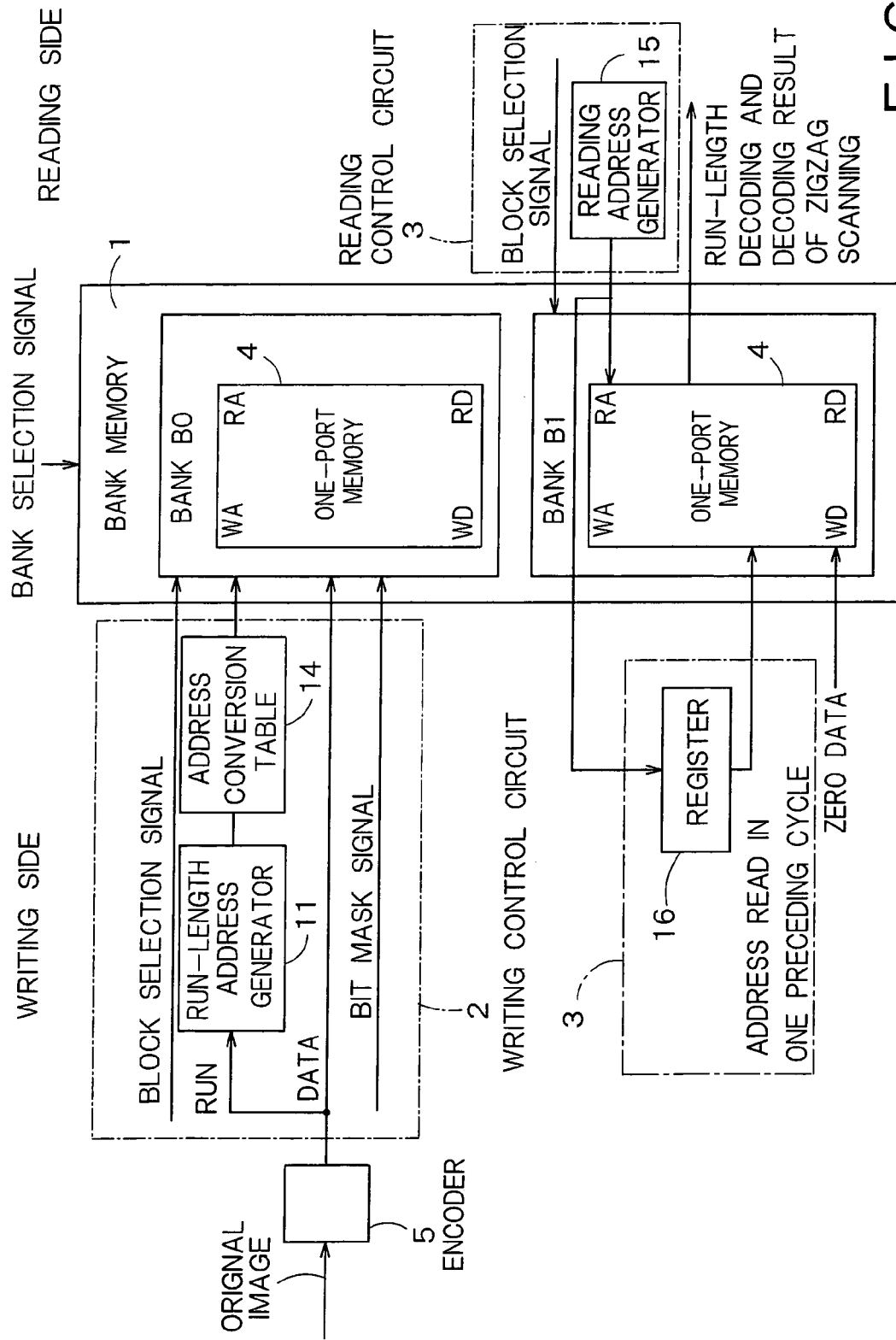
FIG. 8 is a block diagram showing a modification of FIG. 7.

The configuration similar to the second embodiment can be realized by using the one-port memory similar to that shown in FIG. 7. The block diagram in this case is as shown in FIG. 8. In FIG. 8, reading data by unit smaller than the block and zero-clearing.

As described above, in the third embodiment, there is used the one-port memory having a data bus width which is two fold of that of the one-port memory used in the first and second embodiment, and one of an upper side bit string and a lower side bit string of the data bus is alternately selected by each block in order to write data. Therefore, it is possible to perform the data writing operation similar to that in case of providing the two one-port memories. Furthermore, in case of reading data, since all of the data bus is used to read data, data can be read in a short time, and it is possible to have a margin of enough time for zero-clearing the read memory.

As described above, according to the this embodiment, a number of one-port memories can be reduced as compared with the first and second embodiment, thereby reducing the component cost and a packaging area of the circuit.

What is claimed is:

1. A semiconductor memory apparatus comprising:
   two bank areas each having one-port memories capable of performing writing and reading only with separate timings;
   a writing control circuit configured to write data into said one-port memories in one bank area of said two bank areas; and
   a reading control circuit configured to read data from said one-port memories in the other bank area and zero-clearing memory areas from which data has been read, while said writing control circuit is writing data into said one bank area,
   wherein the reading control circuit selects data in the one port memory in one bank area by each block to read out data, and at a next cycle, zero-clears the read-out memory area and reads out data in an other block.

2. The semiconductor memory apparatus according to claim 1, wherein said two bank areas have two pairs of said one-port memories, respectively;
   wherein said writing control circuit alternately selects one pair of said one-port memories in said one bank area by each block to write data; and
   said reading control circuit alternately selects one pair of said one-port memories in the other bank area by each block, reads data, and zero-clears the read blocks, while said writing control circuit is writing data into said one bank area.

3. The semiconductor memory apparatus according to claim 2, wherein said writing control circuit includes a run-length address generation circuit configured to generate run-length addresses, and writes data in said one bank area based on said run-length addresses by each block, and
   said reading control circuit includes a zigzag address generation circuit configured to generate zigzag addresses and a zero-clear address generation circuit configured to generate addresses to be zero-cleared, supplies said zigzag addresses to one pair of said one-port memories in the other bank area to read data by each block, and supplies said zigzag addresses to the other pair of said one-port memories in the other bank area to zero-clear said zigzag addresses by each block.

4. The semiconductor memory apparatus according to claim 2, wherein said writing control circuit selects one pair of said one-port memories in said one bank area by each block, and writes data into a selected block by units smaller than the block, and
   wherein said reading control circuit alternately selects one pair of said one-port memories in the other bank area by unit smaller than the block, reads data, and zero-clears memory areas of the read data in a next reading cycle while said writing control circuit is writing data into said one bank area.

5. The semiconductor memory apparatus according to claim 4, wherein said writing control circuit includes a run-length address generation circuit configured to generate run-length addresses and an address conversion table for performing address conversion of said run-length addresses, selects one pair of said one-port memories in said one bank area based on addresses subjected to address conversion, and writes data into said memories, and
   wherein said reading control circuit includes a reading address generation circuit configured to generate reading addresses so that any pair of said one-port memories in the other bank area is alternately selected and a latch circuit configured to latch said generated reading addresses, supplies said reading addresses generated in said reading address generation circuit to any pair of said one-port memories in the other bank area, reads data, and zero-clears memory areas corresponding to said reading addresses latched by said latch circuit in a next reading cycle.

6. The semiconductor memory apparatus according to claim 4, wherein said reading control circuit alternately selects one pair of said one-port memories in the other bank area every n (n is an integer not less than 1) pixels by block smaller than the block to read data.

7. The semiconductor memory apparatus according to claim 1, wherein block selection signals used for selecting blocks are inputted to said writing control circuit and said reading control circuit.

8. The semiconductor memory apparatus according to claim 1, further comprising an encoder configured to divide an original image into blocks, to quantize each divided block, to align quantized data in the order of zigzag scanning, and to generate run-length codes composed of zero and non-zero formats, wherein said writing control circuit writes run-length codes generated by said encoder into said one-port memories in said two bank areas.

* * * * *